(12) United States Patent
Venkateswaran et al.

(10) Patent No.: US 9,973,204 B1
(45) Date of Patent: May 15, 2018

(54) RESISTOR STRING DIGITAL TO ANALOG CONVERTER

(71) Applicant: TEXAS INSTRUMENTS INCORPORATED, Dallas, TX (US)

(72) Inventors: Muthusubramanian Venkateswaran, Bengaluru (IN); Dattatreya Baragur Suryanarayana, Bangalore (IN); Preetam Tadeparthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/663,149

(22) Filed: Jul. 28, 2017

(51) Int. Cl.
*H03M 1/66* (2006.01)
*H03M 1/80* (2006.01)
*H03M 1/68* (2006.01)
*H03M 1/06* (2006.01)
*H03M 1/74* (2006.01)

(52) U.S. Cl.
CPC ......... *H03M 1/808* (2013.01); *H03M 1/0602* (2013.01); *H03M 1/682* (2013.01); *H03M 1/74* (2013.01)

(58) Field of Classification Search
CPC ...... H03M 1/74; H03M 1/682; H03M 1/0602; H03M 1/808
USPC .................................................. 341/140–150
See application file for complete search history.

(56) References Cited

U.S. PATENT DOCUMENTS

| | | | | |
|---|---|---|---|---|
| 6,239,731 B1* | 5/2001 | Fattaruso | .............. | H03M 1/685 341/144 |
| 6,433,717 B1* | 8/2002 | Leung | ................. | H03M 1/0663 341/144 |
| 6,781,536 B1* | 8/2004 | Martins | ................. | H03M 1/682 341/144 |
| 6,914,547 B1* | 7/2005 | Swaroop | ............... | H03M 1/682 341/144 |
| 8,093,985 B1* | 1/2012 | Kumath | .............. | H03M 1/0604 338/195 |
| 8,618,971 B1* | 12/2013 | Li | ........................... | H03M 1/68 341/144 |
| 2016/0172965 A1* | 6/2016 | Suryanarayana | ..... | H02M 3/156 323/234 |

* cited by examiner

*Primary Examiner* — Lam T Mai
(74) *Attorney, Agent, or Firm* — John R. Pessetto; Charles A. Brill; Frank D. Cimino

(57) ABSTRACT

In some embodiments, a resistor string digital to analog converter (DAC) comprises a first plurality of resistors disposed in a first column. Each of the first plurality of resistors couples to an output of the first column via one of a first plurality of switches. The DAC also comprises a second plurality of resistors disposed in a second column. Each of the second plurality of resistors couples to an output of the second column via one of a second plurality of switches. The second plurality of resistors is configured to couple in series with the first plurality of resistors. A first row selection signal is to control a first switch of the first plurality of switches and a second switch of the second plurality of switches. The first switch corresponds to a first resistor disposed at a top of the first column, and the second switch corresponds to a second resistor disposed at a bottom of the second column.

19 Claims, 5 Drawing Sheets

RESISTOR STRING DIGITAL TO ANALOG CONVERTER

BACKGROUND

Digital to analog converters (DACs) are implemented in a variety of applications to convert signals from digital to analog form. In some implementations, a DAC may provide a stable reference signal to other components that use the reference signal to make decisions or to generate other signals or values. In some instances, a DAC may produce analog reference signals with variations.

SUMMARY

In some embodiments, a resistor string digital to analog converter (DAC) comprises a first plurality of resistors disposed in a first column. Each of the first plurality of resistors couples to an output of the first column via one of a first plurality of switches. The DAC also comprises a second plurality of resistors disposed in a second column. Each of the second plurality of resistors couples to an output of the second column via one of a second plurality of switches. The second plurality of resistors is configured to couple in series with the first plurality of resistors. A first row selection signal is to control a first switch of the first plurality of switches and a second switch of the second plurality of switches. The first switch corresponds to a first resistor disposed at a top of the first column, and the second switch corresponds to a second resistor disposed at a bottom of the second column.

In some embodiments, an apparatus comprises a reference signal output. The apparatus also comprises a plurality of resistors configured to couple in series and arranged into a plurality of columns, each of the plurality of columns having a column output. The apparatus further comprises a plurality of row switches, each of the plurality of row switches coupling at least one of the plurality of resistors to one of the column outputs. The apparatus also includes a plurality of column switches, each of the plurality of column switches coupling a different one of the column outputs to the reference signal output. Each of the row switches is controlled by one of a plurality of row selection signals. A first of the plurality of row switches coupled to a first of the plurality of resistors disposed in a top-most position of a first of the plurality of columns is controlled by a same one of the plurality of row selection signals as a second of the plurality of row switches coupled to a second of the plurality of resistors disposed in a bottom-most position of a second of the plurality of columns.

In some embodiments, a method comprises receiving a digital input signal and decoding a first portion of the digital input signal into a plurality of bits configured to control column switches in a resistor string DAC. The method also comprises decoding a second portion of the digital input signal into another plurality of bits configured to control row switches in the resistor string DAC. The method further includes controlling the column switches according to the plurality of bits and the row switches according to the another plurality of bits to generate a reference signal. One of the plurality of bits that controls a top-most row switch in a first column of the resistor string DAC also controls a bottom-most row switch in a second column of the resistor string DAC.

BRIEF DESCRIPTION OF THE DRAWINGS

For a detailed description of various examples, reference will now be made to the accompanying drawings.

DETAILED DESCRIPTION

Figure 1A:
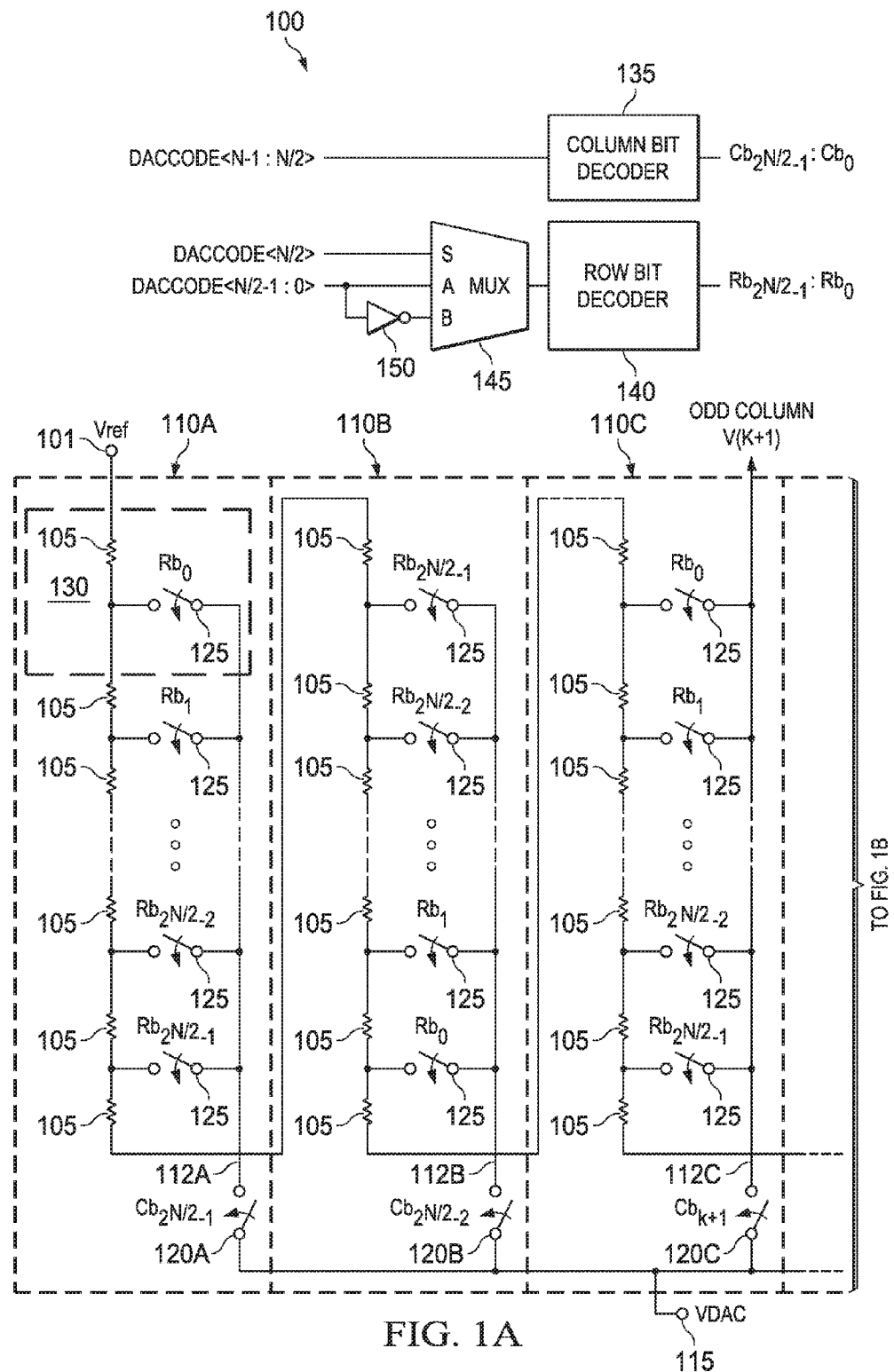
FIGS. 1A and 1B are schematic diagrams of an illustrative resistor string DAC in accordance with various embodiments.

In some embodiments, a direct current to direct current (DC-DC) buck regulator provides an output voltage dependent upon an input voltage and a reference signal received by the DC-DC buck regulator. Although the embodiments are described with reference to a DC-DC buck regulator, the disclosed embodiments may be equally applicable to other forms of voltage regulators generally. The reference signal may be dynamically variable (i.e., such that the reference signal may be changed any desired amount within a predefined range at any one or more times) to control the output voltage of the DC-DC buck regulator. Additionally, a rate of change of the reference signal (e.g., a slew rate) may be controlled based on a desired performance of the DC-DC buck regulator.

One approach for providing the reference signal to the DC-DC buck regulator may include a DAC, such as a resistor string DAC, which provides the DC-DC buck regulator with a programmable analog signal as the reference signal. The resistor string DAC may comprise a plurality of resistors configured to couple in series, where at least some of the resistors may be selectively coupled into an output path of the resistor string, thereby altering a value of the resulting reference signal. The resistors may be selectively coupled into the output path of the resistor string, for example, by closing a switch between at least some of the resistors and the output path of the resistor string. Similarly, at least some of the resistors may be selectively uncoupled from the output path of the resistor string by opening a switch between at least some of the resistors and the output path of the resistor string. A resolution of the resistor string DAC (i.e., a number of different values of the reference signal that may be produced by the resistor string DAC) may be determined according to a number of digital data bits received as input by the resistor string DAC. For example, in some embodiments, the resistor string DAC is an 8-bit resistor string DAC (i.e., configured to receive an 8-bit digital value as input) having about 256 resistors configured to couple in series and about 256 switches coupled between the resistors and the output path of the resistor string DAC. In such embodiments, the resistor string DAC may be said to have a resolution of about 255 (i.e., the number of resistors in the resistor string DAC minus one), meaning that the resistor string DAC is capable of generating about 255 different non-zero values of the reference signal (256 different values when including a value of "0") according to a received 8-bit digital value. Alternatively, the resolution of the resistor string DAC may be characterized by the resistor string DAC's input, in which case the resistor string DAC may be said to have an 8-bit resolution (and thereby be capable of generating about 255 different values of the reference signal according to a received 8-bit digital value). While an 8-bit resistor string DAC is discussed herein, generally, an n-bit resistor string DAC may include $2^n$ resistors and $2^n$ switches and may be capable of generating $2^n-1$ different non-zero values of the reference signal ($2^n$ different values when including a value of "0"), where n is the number of bits received as input by the resistor string DAC.

In some embodiments, the resistors of the resistor string DAC may be arranged in a singular, series-connected string with switches coupling a node between a pair of resistors (or each node between multiple pairs of resistors) to the output path of the resistor string DAC. In other embodiments, the resistors may be grouped and arranged in a plurality of columns (e.g., $2^{n/2}$ columns), where each column has its own respective output path and the output path of each column is coupled to a reference signal output of the resistor string DAC by a switch (referred to as a column switch). Each switch may selectively couple an output path of a column of resistors of the resistor string DAC to the reference signal output of the resistor string DAC.

The digital input received by the resistor string DAC may be provided to one or more decoders. The decoders may be configured to receive the digital input and to decode or convert the digital input into a plurality of control signals. In some embodiments, a number of bits of control signals is greater than a number of bits of the digital input. In other embodiments, the number of bits of control signals is less than the number of bits of the digital input. The decoders may decode the digital input into the control signals according to a predetermined mapping or algorithm. For example, during resistor string DAC manufacture, the decoders may be programmed with one or more relationships between digital inputs and control signals such that the decoders may decode a received digital input of, for example, 8 bits into about 16 bits of control signals for columns of the resistor string DAC and 16 bits of control signals for rows of the resistor string DAC. The plurality of control signals may be used to open and/or close at least some of the column switches and/or the row switches, thereby generating the reference value.

When one of the switches of the resistor string DAC closes (or opens), the resistance value in the output path of the resistor string DAC may be changed by way of an additional resistor being coupled into the output path (or out of the output path). In some circumstances, when a column switch closes (or opens), a glitch may occur. A "glitch" refers to an event that results in the value of the reference signal changing in an undesired manner (e.g., non-linearly). For example, a glitch may cause a sudden, non-linear change from a voltage V to a voltage V" when a desired or linear change would be from the voltage V to a voltage V'.

For example, suppose that V(N,M) is a voltage on the resistor string which is connected to the $N^{th}$ column and $M^{th}$ row of the resistor string DAC (where a row is a combination of a resistor and a switch that follows the resistor), and V(N) is the voltage of the column N. $Cb_i$ and $Rb_j$ represent the column bit and row bit select signals, respectively. When the resistor string DAC is counting up from a column K to a column K+1 (e.g., when a value of the column K is at a maximum and thus the resistor string DAC closes a switch to couple the column K+1 to an output of the resistor string DAC), the row select changes from $Rb_{2^{N/2}-1}$ to $Rb_0$ and the column select changes from $C_k$ to $C_{k+1}$. Before column K+1 is selected, node V(K+1) is pre-charged to $V(K+1,2^{N/2})$. Due to gate delay mismatches and/or routing in the digital signals (e.g., the digital input received by the resistor string DAC and/or the column bit and row bit select signals), either the row select or the column select will be delayed. If $Cb_{k+1}$ turns on before $Rb_0$ due to delays, the output voltage of the resistor string DAC may tend to glitch up from $V(K, 2^{N/2})$ to $V(K+1,2^{N/2})$. On the other hand, if $Rb_0$ turns on before $Cb_{k+1}$, the output voltage of the resistor string DAC may tend to glitch down from $V(K, 2^{N/2})$ to V(K,0). The amount of glitch may be as high as 16 least significant bits (LSBs) in an 8-bit resistor string DAC. Similarly, if there is overlap between the column bit selectors or row bit selectors, an entire column of the resistor string DAC may be shorted through the switches and cause similarly large glitches.

Disclosed herein are embodiments that may provide for a column-based resistor string DAC configured to minimize glitches resulting from column transitions in the resistor string DAC. The disclosed embodiments may provide for resistor strings separated into odd and even columns in the resistor string DAC to minimize a magnitude of glitches in the output of the resistor string DAC to 1 LSB. When a column select bit of the resistor string DAC is even, the lower half of the input to the resistor string DAC (e.g., the N/2 LSBs, where N is the number of bits in the input received by the resistor string DAC) may be passed directly to a decoder for decoding prior to being used to activate (or deactivate) at least some of the switches coupled to the resistors. When the column select bit of the resistor string DAC is odd, the lower half of the input to the resistor string DAC may be inverted prior to being passed to the decoder for decoding and used to activate (or deactivate) at least some of the switches coupled to the resistors. In this way, glitches in the resistor string DAC are minimized, for example, to 1 LSB.

Figure 1B:
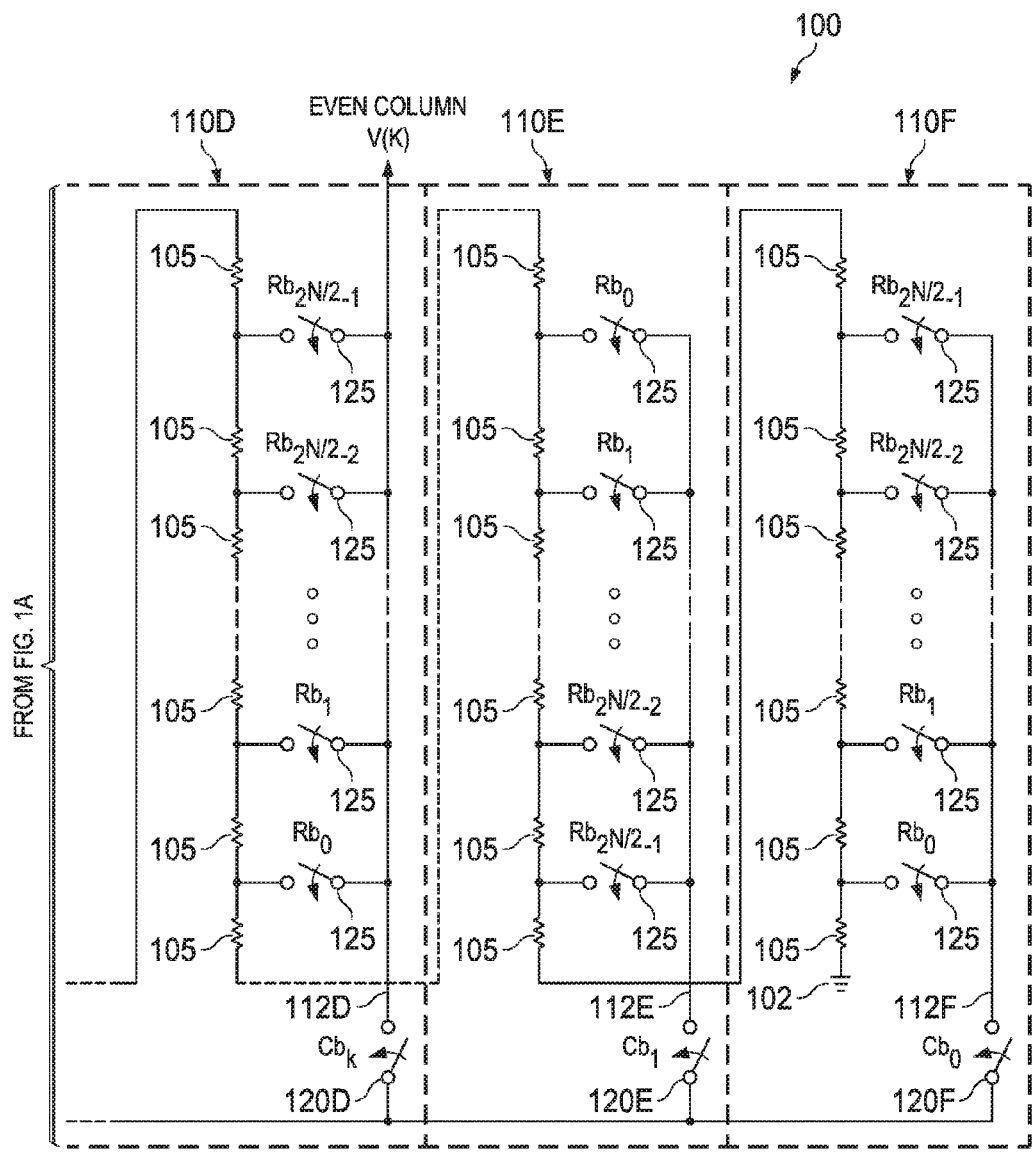

FIGS. 1A and 1B are schematic diagrams of an illustrative resistor string DAC 100 in accordance with various embodiments. The resistor string DAC 100 may be configured to receive a digital input (noted in FIG. 1A as DACCODE) comprising N number of bits (e.g., 8 bits) from a first device (not shown), such as a counter, and to output an analog reference signal (VDAC) based on the received digital input to a second device (not shown) such as a voltage regulator (e.g., a DC-DC regulator such as a DC-DC buck and/or boost regulator). The resistor string DAC 100 may include a plurality of resistors 105 configured to couple in series. The string of resistors 105 is coupled at one end to a reference voltage (Vref) 101 and at the other end to ground 102. The Vref may be any suitable value, for example, chosen based on a desired maximum and/or minimum value for the reference signal output by the resistor string DAC 100. In some embodiments, the resistor string DAC 100 includes $2^N$ resistors 105, where N is a number of bits received by the resistor string DAC as input for controlling a value of an output of the resistor string DAC 100. The resistors 105 may be arranged into a plurality of columns 110A, 110B, 110C, 110D, 110E, and 110F (110A-110F), where each column has a corresponding column output 112A, 112B, 112C, 112D, 112E, and 112F (112A-112F). Each of the column outputs 112A-112F may couple to an output 115 of the resistor string DAC via a respective column switch 120A, 120B, 120C, 120D, 120E, and 120F (120A-120F). Each of the resistors may couple to a column output 112A-112F via a respective row switch 125, such that a resistor string DAC 100 including $2^N$ resistors 105 may also include $2^N$ row switches 125, and such that a resistor 105 and its corresponding row switch 125 together form a row 130 of a respective column 110A-110F. While six columns 110A-110F, each having four rows 130, are illustrated in FIGS. 1A and 1B, such is only for the sake of illustration and clarity of discussion. The resistor string DAC 100 may include any number of columns and/or rows. A number of columns and rows in each column is determined, for example, according to $2^{N/2}$ (e.g., 16 columns, each column including 16 rows, when the resistor string DAC receives an 8-bit input).

The resistor string DAC 100 may further comprise a column bit decoder 135 and a row bit decoder 140. The column bit decoder 135 may be configured to receive a digital input (e.g., a numerical value in binary representation) having a first number of bits (e.g., 4 bits when the resistor string DAC 100 receives an 8-bit input) and output a second number of bits, where the second number of bits is greater than the first number of bits, and where values of each of the second number of bits are determined according to values of each of the first number of bits and a predetermined mapping. The predetermined mapping may, for example, be programmed in the column bit decoder 135 at a time of manufacture and may be unchanging. In some embodiments, the digital input received by the column bit decoder 135 is a half of the input received by the resistor string DAC 100 that includes a most significant bit (MSB) of the input received by the resistor string DAC 100. This digital input may be referred to as a column select signal. A number of output bits of the column bit decoder 135 is identical, or is substantially similar, to a number of columns in the resistor string DAC 100. Each output bit of the column bit decoder 135 may be provided to a respective column switch (e.g., a respective column switch 120A-120F) such that a state of the column switch (e.g., an open state or a closed state) is controlled by a value of the respective output bit.

The row bit decoder 140 may be configured to receive a digital input (e.g., a numerical value in binary representation) having a first number of bits (e.g., 4 bits when the resistor string DAC 100 receives an 8-bit input) and output a second number of bits, where the second number of bits is greater than the first number of bits, and where values of each of the second number of bits are determined according to values of each of the first number of bits and a predetermined mapping. The predetermined mapping may, for example, be programmed in the row bit decoder 140 at a time of manufacture and may be unchanging. In some embodiments, the digital input received by the row bit decoder 140 is a half of the input received by the resistor string DAC 100 that includes a least significant bit (LSB) of the input received by the resistor string DAC 100. This digital input may be referred to as a row select signal. A number of output bits of the row bit decoder 140 is identical, or is substantially similar, to a number of rows in any column (e.g., any column 110A-110F) of the resistor string DAC 100. Each output bit of the row bit decoder 140 may be provided to a respective row switch 125 such that a state of the row switch 125 (e.g., an open state or a closed state) is controlled by a value of the respective output bit.

For example, as a value of the input received by the resistor string DAC 100 changes (e.g., increases or decreases), values of at least some of the outputs of the column bit decoder 135 and the row bit decoder 140 change such that at least some of the column switches 120A-120F and row switches 125 are toggled to cause a corresponding change in a value of the output of the resistor string DAC 100. The change in the value to the output of the resistor string DAC 100 may in some embodiments be linearly proportional to the change in the value of the input received by the resistor string DAC 100, while in other embodiments the change in the value to the output of the resistor string DAC 100 may have any other suitable, predetermined relationship to the change in the value of the input received by the resistor string DAC 100.

Each of the column switches 120A-120F and the row switches 125 may comprise mechanical switches (e.g., relays) or electrical switches (e.g., transistors or other electrical components, which may sometimes be referred to as solid-state switches). For example, the column switches 120A-120F and the row switches 125 may each comprise bipolar junction transistors (BJTs), metal oxide semiconductor field effect transistors (MOSFETs), or any other suitable electrical or solid-state device capable of selectively creating a closed circuit or an open circuit between two points. In some embodiments, each of the column switches 120A-120F and the row switches 125 is a same type of switch, while in other embodiments the column switches 120A-120F and the row switches 125 may each be any suitable type of switch without regard for a type of switch of the remainder of the column switches 120A-120F and the row switches 125.

Generally, each of the column switches 120A-120F and the row switches 125 may comprise at least three terminals: a first terminal, a second terminal, and a control terminal that is controllable to couple the first terminal to the second terminal (close the circuit) or decouple the first terminal from the second terminal (open the circuit). The control terminal of each of the column switches 120A-120F may couple to a respective output bit of the column bit decoder 135 and the control terminal of each of the row switches 125 may couple to a respective output bit of the row bit decoder 140. In some embodiments, when an output bit of the column bit decoder 135 is "1," a column switch 120A-120F coupled to the respective output bit of the column bit decoder 135 is closed, thereby creating a closed circuit and coupling a respective column 110A-110F to the output of the resistor string DAC 100. In some embodiments, when an output bit of the column bit decoder 135 is "0," a column switch 120A-120F coupled to the respective output bit of the column bit decoder 135 is opened, thereby creating an open circuit and decoupling a respective column 110A-110F from the output of the resistor string DAC 100. In some embodiments, logical functionality may be reversed such that a column switch 120A-120F creates a closed circuit when it receives a "0" at its control terminal and creates an open circuit when it receives a "1" at its control terminal.

In some embodiments, when an output bit of the row bit decoder 140 is "1," a row switch 125 in each column 110A-110F that couples to the respective output bit of the row bit decoder 140 is closed, thereby creating a closed circuit and coupling a respective resistor 105 of a same row as the row switch 125 to a column output 112A-112F of the respective column 110A-110F. When an output bit of the row bit decoder 140 is "0," the row switches 125 coupled to the respective output bit of the row bit decoder 140 may be opened, thereby creating an open circuit and decoupling a respective resistor 105 from a column output 112A-112F. In some embodiments, logical functionality is reversed such that a row switch 125 creates a closed circuit when it receives a "O" at its control terminal and creates an open circuit when it receives a "1" at its control terminal.

To minimize the magnitude of a glitch of the resistor string DAC 100, rows 130 of the resistor string DAC 100 are organized in an alternating manner in adjacent columns 110A-110F. For example, in column 110A, a first resistor 105 is disposed in a top row 130 of the column 110A and a $2^{m/2}-1$ resistor 105 is disposed in a row 130 at the bottom of the column 110A. In column 110B, a $2^{n/2}-1$ resistor 105 is disposed in a row 130 at the top of the column 110B and a first resistor 105 is disposed in a row 130 at a bottom of the column 110B. For example, a top row switch in a first column may be coupled to the same row control signal as a bottom row switch in a second column adjacent to the first column. In this way, when a transition occurs such that column switch 120A is closed and column switch 120B is opened (or vice versa), a next resistor 105 along the series coupling in the resistor string DAC 100 may be controlled by a same output bit of the row bit decoder 140, thereby minimizing any glitch in the resistor string DAC to about 1 LSB.

The resistor string DAC 100 may further comprise a multiplexer 145 coupled to the input of the row bit decoder 140 and an inverter 150 coupled to a second input of the multiplexer 145. While the multiplexer 145 and the inverter 150 have each been illustrated as singular components, such is only for the sake of illustration and clarity of discussion. The resistor string DAC 100 may include any number of multiplexers 145 and inverters 150. For example, the resistor string DAC 100 may include an identical, or substantially similar, number of multiplexers 145 and inverters 150 to a number of bits in the row select signal (e.g., one-half of the number of bits received as digital input by the resistor string DAC 100), where each multiplexer 145 and inverter 150 corresponds to, and receives, one bit of the row select signal. When the column select signal is even (e.g., bit N/2 of the input received by the resistor string DAC 100 is "0"), the multiplexer 145 passes the row select signal directly to the row bit decoder 140 for decoding and control of the row switches 125, as discussed above. When the column select signal is odd (e.g., bit N/2 of the input received by the resistor string DAC 100 is "1"), the inverters 150 invert each bit of the row select signal prior to the multiplexers 145 passing the inverted row select signal to the row bit decoder 140 for decoding and control of the row switches 125, as discussed above.

Figure 2A:
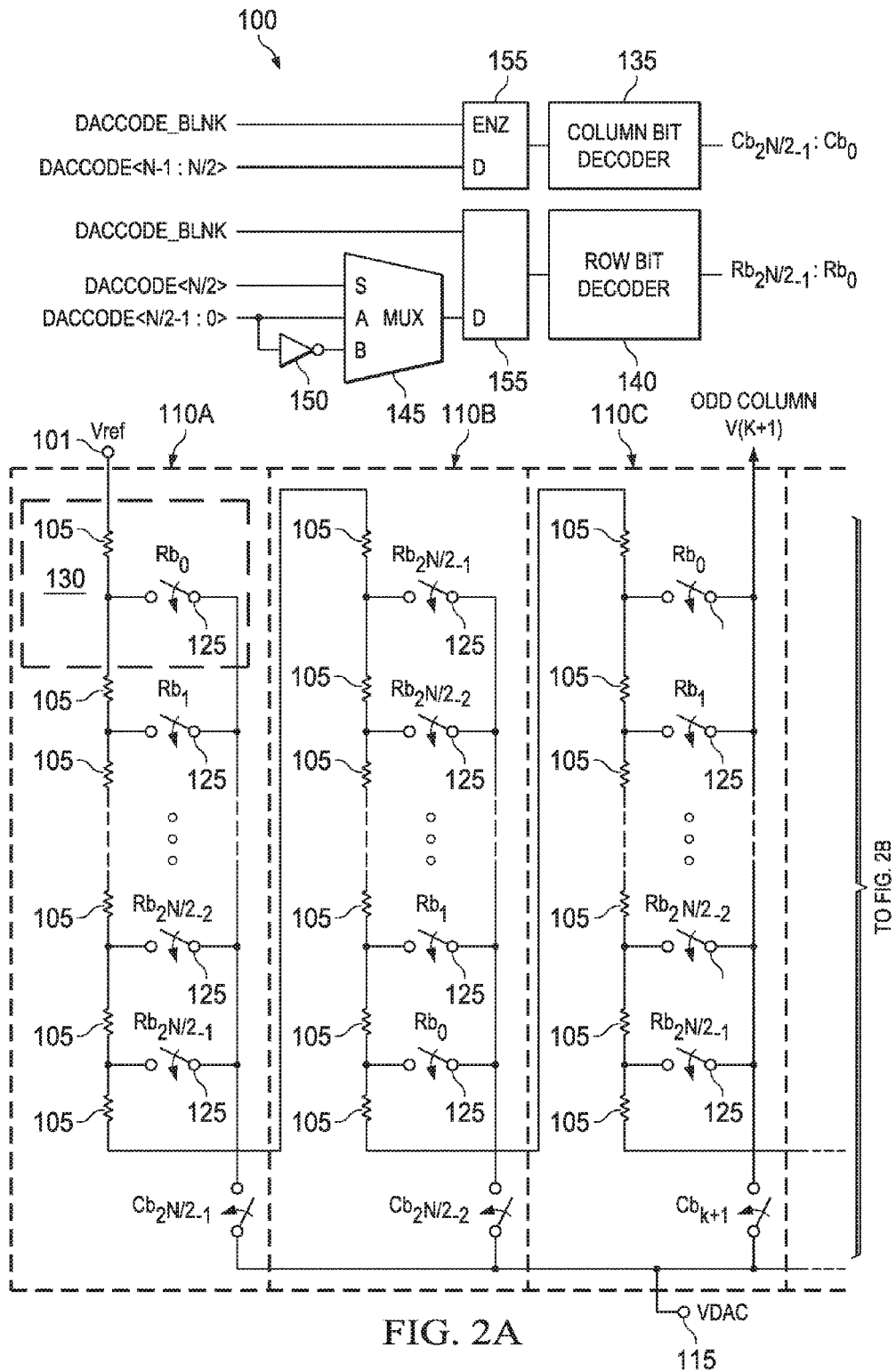
FIGS. 2A and 2B are schematic diagrams of the illustrative resistor string DAC in accordance with various embodiments.
Figure 2B:
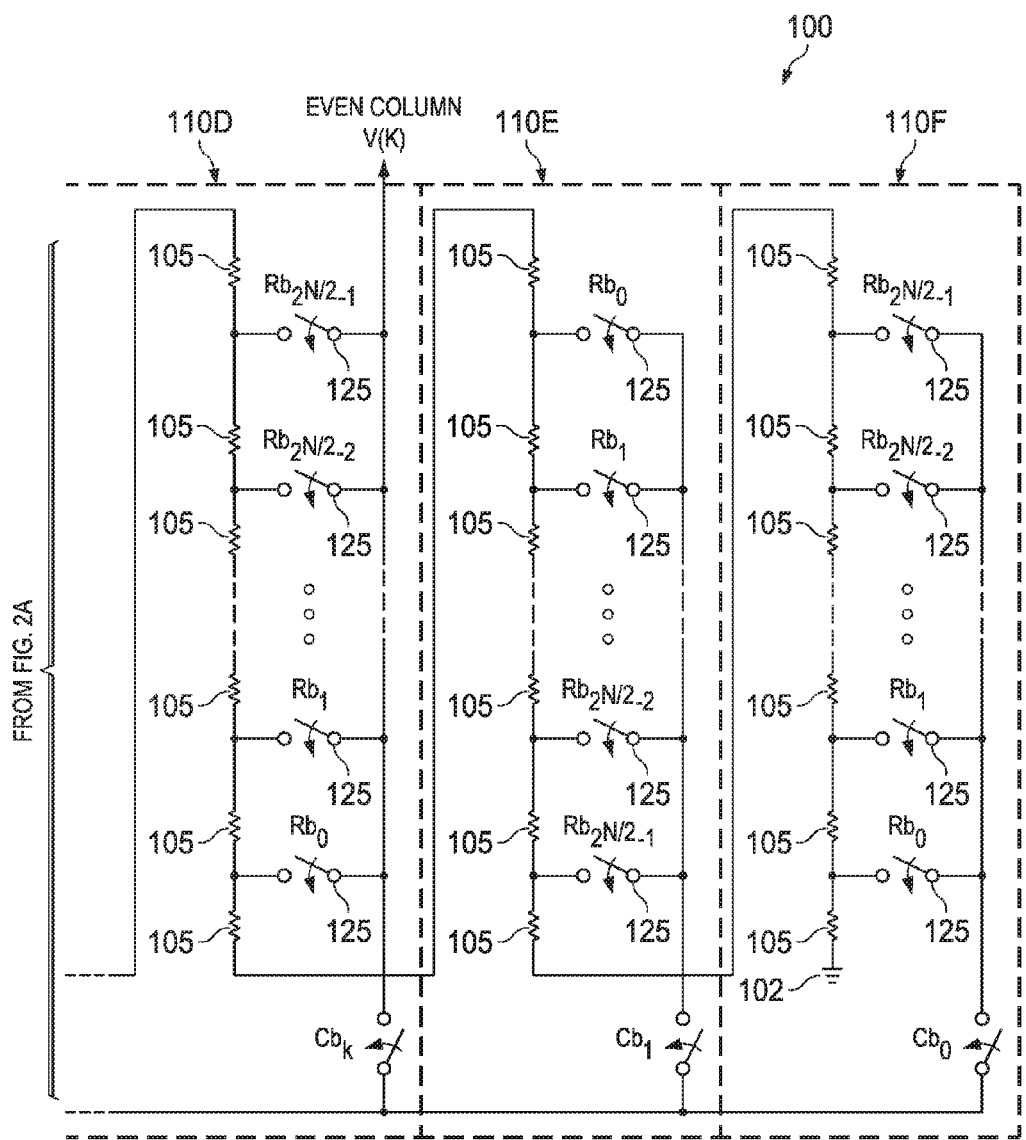

FIGS. 2A and 2B are schematic diagrams of the illustrative resistor string DAC 100 in accordance with various embodiments. Each of the bits of the input received by the resistor string DAC 100 may change simultaneously. Such a simultaneous change may result in an output glitch of the multiplexers 145. To mitigate such an output glitch of the multiplexers 145, the resistor string DAC 100 may comprise a plurality of latches 155 coupled to the inputs of the column bit decoder 135 and the row bit decoder 140. For example, the resistor string DAC 100 may comprise N latches 155, where each bit of input of the column bit decoder 135 and the row bit decoder 140 is latched via one of the latches 155. When a transition occurs in the input received by the resistor string DAC 100, each of the latches 155 may blank a corresponding input of the column bit decoder 135 and/or the row bit decoder 140. For example, the latches 155 may blank the column bit decoder 135 and/or the row bit decoder 140 by each providing a momentary input of "1" to the column bit decoder 135 and/or the row bit decoder 140 or each providing a momentary input of "0" to the column bit decoder 135 and/or the row bit decoder 140. The latches 155 may provide the momentary inputs to the column bit decoder 135 and/or the row bit decoder 140 in response to receipt of a signal (e.g., a blank command instructing the latches 155 to blank the column bit decoder 135 and/or the row bit decoder 140, noted in FIG. 2A as DACCODE_BLNK) and may cease blanking the column bit decoder 135 and/or the row bit decoder 140 in response to no longer receiving the signal.

Figure 3:
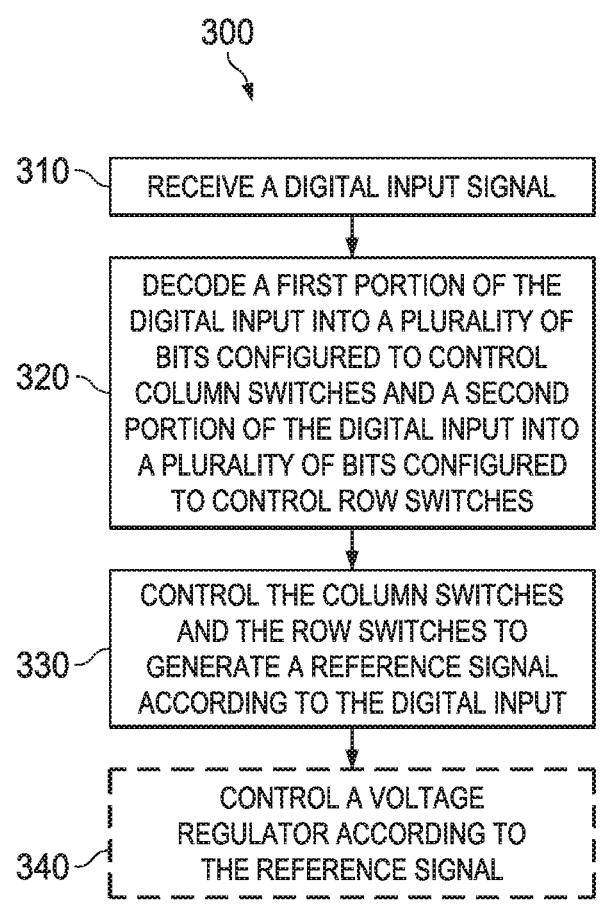
FIG. 3 is a flowchart of a method for generating a resistor string DAC output according to various embodiments.

FIG. 3 is a flowchart of a method 300 for generation of a resistor string DAC output according to various embodiments. The method 300 may be implemented by a resistor string DAC, such as the resistor string DAC 100, as discussed above. The method 300 may be implemented to, for example, generate a reference signal for use by a DC-DC regulator.

At operation 310, the resistor string DAC receives a digital input signal. The digital input signal is received from, for example, a counter, a processor, or any other suitable electrical component. At operation 320, the resistor string DAC decodes a first portion of the digital input into a plurality of bits configured to control column switches in the resistor string DAC and decodes a second portion of the digital input into a plurality of bits configured to control row switches in the resistor string DAC. In some embodiments, prior to decoding the second portion of the digital input into the plurality of bits configured to control the row switches in the resistor string DAC, the digital input signal is inverted.

At operation 330, the resistor string DAC controls the column switches and the row switches to generate the reference signal according to the digital input. For example, the resistor string DAC controls the column switches according to the plurality of bits configured to control column switches and controls the row switches according to the plurality of bits configured to control row switches. When a value of the second portion of the digital input changes, a corresponding change occurs in the plurality of bits configured to control row switches in the resistor string DAC, thereby causing the resistor string DAC to control the row switches. When a value of the first portion of the digital input changes, a corresponding change occurs in the plurality of bits configured to control column switches in the resistor string DAC, thereby causing the resistor string DAC to control a column switch. When a top-most switch in a column of the resistor string DAC is controlled by a row control signal and is toggled closed and a value of the second portion of the digital input changes, a column switch of an adjacent column may toggle closed. When the column switch of an adjacent column toggles closed, a bottom-most resistor of the adjacent column may also be controlled by the row control signal such that a value of the reference signal output by the resistor string DAC changes no more than necessary for a 1 LSB change in the binary input. Optionally, the method 300 further includes operation 340. At operation 340, a voltage regulator is controlled according to the reference signal output by the resistor string DAC.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other intervening devices and/or connections. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A resistor string digital to analog converter (DAC), comprising:
   a first plurality of resistors disposed in a first column, each of the first plurality of resistors coupled to an output of the first column via one of a first plurality of switches; and
   a second plurality of resistors disposed in a second column, each of the second plurality of resistors coupled to an output of the second column via one of a second plurality of switches, the second plurality of resistors configured to couple in series with the first plurality of resistors, wherein a first row selection signal is to control a first switch of the first plurality of switches and a second switch of the second plurality of switches, the first switch corresponds to a first resistor disposed at a top of the first column, and the second switch corresponds to a second resistor disposed at a bottom of the second column:
 a first decoder configured to decode a first portion of a digital input into a plurality of column selection signals; and
 a second decoder configured to decode a second portion of the digital input into a plurality of row selection signals, wherein each of the plurality of row selection signals controls one of the first plurality of switches and one of the second plurality of switches.

2. The DAC of claim 1, further comprising:
 a first column switch coupling the output of the first column to an output of the resistor string DAC; and
 a second column switch coupling the output of the second column to the output of the resistor string DAC, wherein a first of the plurality of column selection signals is to control the first column switch, and wherein a second of the plurality of column selection signals is to control the second column switch.

3. The DAC of claim 2, wherein a change in the output of the resistor string DAC when one of the first column switch or the second column switch is toggled corresponds to not more than 1 least significant bit of the digital input.

4. The DAC of claim 3, further comprising:
 a multiplexer having an output coupled to an input of the second decoder; and
 an inverter coupled to a second input of the multiplexer, wherein the inverter is to receive the digital input and generate an inverted digital input, and wherein the multiplexer is to:
  receive the digital input at a first input of the multiplexer;
  pass the digital input to the second decoder when a column selection bit is even;
  receive the inverted digital input at the second input of the multiplexer; and
  pass the inverted digital input to the second decoder when the column selection bit is odd.

5. The DAC of claim 4, wherein the column selection bit is a $N/2^{th}$ bit of the digital input, wherein N is a total number of bits in the digital input.

6. The DAC of claim 4, further comprising:
 a first latch coupled to an input of the first decoder; and
 a second latch coupled between the output of the multiplexer and the second decoder, wherein the first latch and the second latch are configured to provide blanking signals to the first decoder and the second decoder, respectively.

7. The DAC of claim 1, wherein the first portion of the digital input comprises a half of the digital input comprising a most significant bit of the digital input, and wherein the second portion of the digital input comprises another half of the digital input comprising a least significant bit of the digital input.

8. An apparatus, comprising:
 a reference signal output;
 a plurality of resistors configured to couple in series and arranged into a plurality of columns, each of the plurality of columns having a column output;
 a plurality of row switches, each of the plurality of row switches coupling at least one of the plurality of resistors to one of the column outputs; and
 a plurality of column switches, each of the plurality of column switches coupling a different one of the column outputs to the reference signal output,
 wherein each of the row switches is controlled by one of a plurality of row selection signals, and
 wherein a first of the plurality of row switches coupled to a first of the plurality of resistors disposed in a top-most position of a first of the plurality of columns is controlled by a same one of the plurality of row selection signals as a second of the plurality of row switches coupled to a second of the plurality of resistors disposed in a bottom-most position of a second of the plurality of columns.

9. The apparatus of claim 8, further comprising:
 a first decoder configured to decode a first portion of a digital input into a plurality of column selection signals; and
 a second decoder configured to decode a second portion of the digital input into the plurality of row selection signals.

10. The apparatus of claim 9, further comprising:
 a multiplexer having an output coupled to an input of the second decoder; and
 an inverter coupled to a second input of the multiplexer, wherein the inverter is to receive the digital input and generate an inverted digital input, and wherein the multiplexer is to:
  receive the digital input at a first input of the multiplexer;
  pass the digital input to the second decoder when a column selection bit is even;
  receive the inverted digital input at the second input of the multiplexer; and
  pass the inverted digital input to the second decoder when the column selection bit is odd.

11. The apparatus of claim 10, wherein the column selection bit is a $N/2^{th}$ bit of the digital input, wherein N is a total number of bits in the digital input.

12. The apparatus of claim 10, further comprising:
 a first latch coupled to an input of the first decoder; and
 a second latch coupled between the output of the multiplexer and the second decoder, wherein the first latch and the second latch are configured to provide blanking signals to the first decoder and the second decoder, respectively.

13. The apparatus of claim 9, wherein the first portion of the digital input comprises a half of the digital input comprising a most significant bit of the digital input, and wherein the second portion of the digital input comprises another half of the digital input comprising a least significant bit of the digital input.

14. The apparatus of claim 9, wherein the first of the plurality of columns and the second of the plurality of columns are physically positioned such that no other of the plurality of columns is positioned between the first of the plurality of columns and the second of the plurality of columns.

15. A method, comprising:
 receiving a digital input signal;
 decoding a first portion of the digital input signal into a plurality of bits configured to control column switches in a resistor string digital to analog converter (DAC);

decoding a second portion of the digital input signal into another plurality of bits configured to control row switches in the resistor string DAC; and controlling the column switches according to the plurality of bits and the row switches according to the another plurality of bits to generate a reference signal, wherein one of the plurality of bits that controls a top-most row switch in a first column of the resistor string DAC also controls a bottom-most row switch in a second column of the resistor string DAC.

16. The method of claim 15, further comprising controlling the column switches and the row switches such that a value of the reference signal is within one least significant bit of a value of the digital input signal.

17. The method of claim 15, further comprising inverting the digital input signal prior to decoding the second portion of the digital input signal into the another plurality of bits.

18. The method of claim 15, wherein controlling the column switches and the row switches to generate the reference signal alters a value of the reference signal.

19. The method of claim 15, further comprising controlling a voltage regulator according to the reference signal.

* * * * *